United States Patent [19]

Chen

[11] Patent Number: 5,397,732

[45] Date of Patent: Mar. 14, 1995

[54] PBLOCOS WITH SANDWICHED THIN SILICON NITRIDE LAYER

[75] Inventor: Chung-Zen Chen, Taipei, Taiwan, Prov. of China

[73] Assignee: Industrial Technology Research Institute, Hsinchu, Taiwan, Prov. of China

[21] Appl. No.: 94,745

[22] Filed: Jul. 22, 1993

[51] Int. Cl.⁶ .......................................... H01L 21/76
[52] U.S. Cl. .................................... 437/69; 437/70
[58] Field of Search ............................ 437/69, 70; 148/DIG. 85, DIG. 86, DIG. 117

[56] References Cited

U.S. PATENT DOCUMENTS

| | | | |
|---|---|---|---|
| 4,829,019 | 5/1989 | Mitchell et al. | 437/69 |
| 5,002,898 | 3/1991 | Fritzinger et al. | 437/69 |
| 5,215,930 | 6/1993 | Lee et al. | 437/69 |

FOREIGN PATENT DOCUMENTS

| | | |
|---|---|---|
| 57-39551 | 3/1982 | Japan . |
| 61-81649 | 4/1986 | Japan . |
| 61-244041 | 10/1986 | Japan . |
| 63-137457 | 6/1988 | Japan . |
| 1187950 | 7/1989 | Japan . |

OTHER PUBLICATIONS

Ghandhi, S., *VLSI Fabrication Principles: Silicon & Gallium Arsenide*, 1983, John Wiley & Sons, p. 360.

*Primary Examiner*—George Fourson
*Attorney, Agent, or Firm*—George O. Saile; Stephen B. Ackerman

[57] ABSTRACT

A method of forming a silicon oxide isolation region with reduced bird's beak length on the surface of a silicon substrate is described. A layer of silicon oxide is formed on the surface of the silicon substrate. A first layer of silicon nitride is formed on the surface of the silicon oxide layer, to prevent diffusion of oxygen into the silicon oxide layer and the substrate during subsequent oxidation steps, thereby reducing the bird's beak length. A layer of polysilicon is formed on the surface of the silicon nitride layer. A second layer of silicon nitride is formed on the surface of the polysilicon layer. The second silicon nitride layer, the polysilicon layer and the first silicon nitride layer are patterned to form an oxidation mask and to form an opening over the silicon oxide layer. The silicon substrate is ion implanted through the opening to form a channel stop implant. The silicon substrate and silicon oxide layer in the region not masked by the oxidation mask are oxidized to form the silicon oxide isolation region. A thin surface oxide layer forms on the surface of the second silicon nitride layer during this oxidation step. The thin surface oxide layer and second silicon nitride layer are removed. The polysilicon layer is oxidized, and then removed. The first silicon nitride layer is then removed. Finally, the silicon oxide layer is removed to complete formation of the silicon oxide isolation region.

19 Claims, 3 Drawing Sheets

PBLOCOS WITH SANDWICHED THIN SILICON NITRIDE LAYER

BACKGROUND OF THE INVENTION

1. Field of the Invention

The invention relates to the manufacture of highly dense integrated circuits and more particularly to the formation of a silicon oxide isolation region within the integrated circuit.

2. Description of the Prior Art

In the manufacture of highly dense integrated circuits, individual device structures are typically separated and electrically isolated by means of a silicon oxide isolation region, also referred to as a field oxide isolation region. The isolation region is typically produced by the exposure of a silicon wafer to an oxidizing atmosphere while using an oxidation mask to protect regions which are not desired to be oxidized. These latter regions will be the location for the active device structures. One widely used technique for creating isolation regions is called LOCOS—for LOCal Oxidation of Silicon.

In the LOCOS technique, a pad oxide is grown on the surface of a silicon substrate. A silicon nitride layer is deposited on the surface of the pad oxide, and then patterned to create an oxidation mask. The exposed areas of the substrate are then oxidized to form the silicon oxide isolation regions. The oxidation mask is removed and the device structures are created in subsequent processing steps.

The LOCOS method has problems, however, especially as device geometries continue to get smaller. During oxidation, oxygen diffuses through the pad oxide to the substrate and forms an undesired "bird's beak". The bird's beak extends the silicon isolation region into the active device region, reducing the area in which devices can be built.

To reduce the bird's beak problem, a layer of undoped polysilicon is added between the pad oxide and silicon nitride layers, in what is referred to as PBLOCOS, or Polysilicon Buffered LOCal Oxidation of Silicon. An example is shown in U.S. Pat. No. 4,829,019. The polysilicon layer in this invention is intended to block oxygen from diffusing into the pad oxide and substrate, thereby reducing the bird's beak length.

Three notable problems exist, however, in the use of PBLOCOS. These are "pits" in the polysilicon layer, bird's beak, and the oxide thinning effect. FIG. 1 shows the prior art. Shown are substrate 10, pad oxide layer 12, undoped polysilicon layer 14, and silicon nitride layer 16. During formation of the field oxide 18, as shown in FIG. 2, the polysilicon in the vicinity of the field oxide tends to be weakened due to stress. Also, small regions of the polysilicon at the boundary of the field oxidation region are converted into silicon nitride during field oxidation. During etch of the silicon nitride layer, these small regions are etched out and pits 20 are formed. During the subsequent reactive ion etch of the polysilicon, these pits can extend through the pad oxide layer 12 to the silicon substrate 10 and cause damage.

Workers in the field are well aware of the pitting problem. One solution is a two-step oxidation of the polysilicon layer, after removal of the silicon nitride. The polysilicon is oxidized, then etched with a dip-back etch, then oxidized again and etched again. This eliminates the pits problem, but adds several processing steps and may cause unwanted substrate oxidation.

Another solution to the "pits" problem has been patented by L. B. Fritzinger et al in U.S. Pat. No. 5,002,898. The novel solution consists of adding a protective oxide layer between the polysilicon buffer and silicon nitride layers. Removal of the silicon nitride by wet etching does not affect the polysilicon layer due to the protection afforded by the protective oxide. The protective oxide and polysilicon layers may then be removed without damage to the substrate.

The second problem with the PBLOCOS technique is the bird's beak effect. Though the polysilicon buffer layer reduces the bird's beak length when compared with using LOCOS, it is still a problem, particularly as device geometries continue to decrease. Polysilicon oxidizes near the polysilicon/field oxide interface, and oxygen may diffuse through to the pad oxide and silicon substrate, causing the bird's beak. If doped polysilicon is used, an even longer bird's beak length results due to the faster oxidation of doped polysilicon versus undoped polysilicon.

The third problem is the "oxide thinning effect". This is a thinning of the oxide at the interface of the gate oxide and field oxide regions. The oxidized polysilicon in the PBLOCOS technique must be removed before gate oxide growth. It is desirable to have a planar topography, i.e., limit the field oxide thickness above the silicon surface, therefore as shown in FIG. 2A the dip-back thickness 22 must be large. This exposes region 24, which has a slower oxidation rate than the horizontal portion of the substrate. Thus the oxide thickness in region 24 is thinner and more likely to break down.

JA 57-39551 (Miyazawa) shows a variation on PBLOCOS in which the polysilicon layer is formed on the nitride layer, which is deposited on the oxide. A photoresist is formed with an opening smaller than the poly/nitride opening to create a mask for field implant, to form an offset between the field implant and field oxidation window. The photoresist is stripped and field oxidation is completed, however the top layer of polysilicon also oxidizes since it is exposed.

SUMMARY OF THE INVENTION

It is therefore a principal object of the invention to overcome the problem of pitting when using the PBLOCOS technique to form field isolation regions in integrated circuits.

It is a further object of the invention to reduce the bird's beak length of the field isolation region when using PBLOCOS, in order to increase available area for the active device structures.

It is a further object of the invention to eliminate the oxide thinning effect.

These objects are achieved by forming a silicon oxide isolation region with reduced bird's beak length on the surface of a silicon substrate. A layer of silicon oxide is formed on the surface of the silicon substrate. A first layer of silicon nitride is formed on the surface of the silicon oxide layer, to prevent diffusion of oxygen into the silicon oxide layer and the substrate during subsequent oxidation steps, thereby reducing the bird's beak length. A layer of polysilicon is formed on the surface of the silicon nitride layer. A second layer of silicon nitride is formed on the surface of the polysilicon layer. The second silicon nitride layer, the polysilicon layer and the first silicon nitride layer are patterned to form an oxidation mask and to form an opening over the silicon oxide layer. The silicon substrate is ion implanted through the opening to form a channel stop implant. The silicon substrate and silicon oxide layer in the region not masked by the oxidation mask are oxidized to form the silicon oxide isolation region. A thin surface oxide layer forms on the surface of the second silicon nitride layer during this oxidation step. The thin surface oxide layer and second silicon nitride layer are removed. The polysilicon layer is oxidized, and then removed. The first silicon nitride layer is then removed. Finally, the silicon oxide layer is removed to complete formation of the silicon oxide isolation region.

DESCRIPTION OF THE PREFERRED EMBODIMENTS

Figure 1:
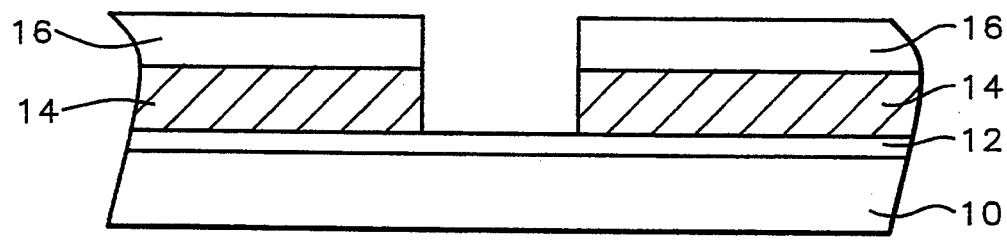
FIGS. 1, 2 and 2A are a schematic cross-sectional representation of the result of a Prior Art process for forming the field oxide region of an integrated circuit which includes the pitting problem.
Figure 2:
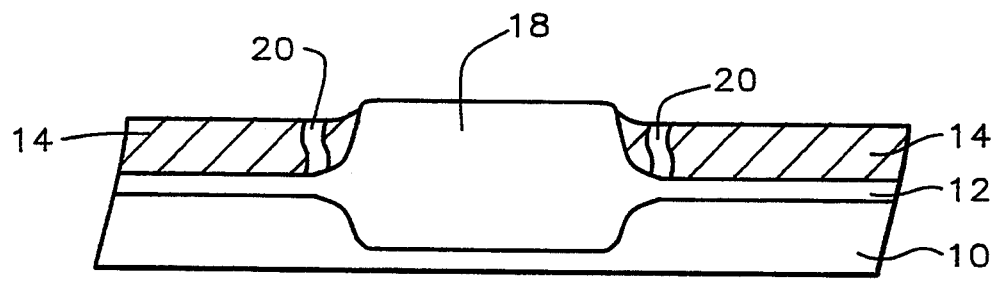
Figure 2A:
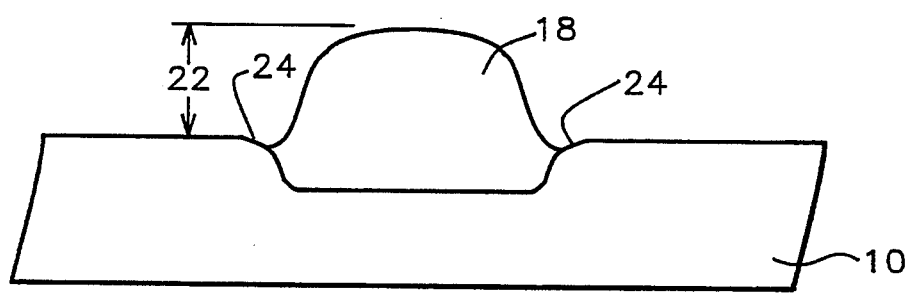
Figure 3:
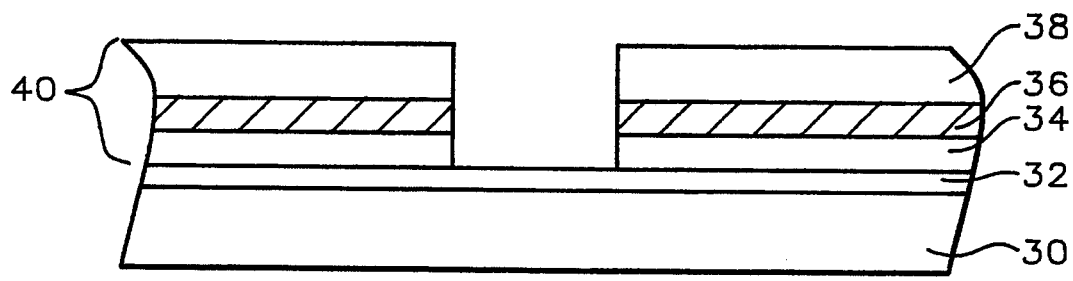
FIGS. 3 to 9 are a schematic cross-sectional representation of a new method for forming the field oxide region.

Referring now more particularly to FIG. 3, there is shown an embodiment method for making the field oxide isolation region of the present invention. The first series of steps involves the formation of the pad oxide layer 32 on the silicon substrate 30. The surface of the silicon substrate 30 is thermally oxidized to form the desired pad oxide layer 32, by exposure to dry or wet oxygen at a temperature of between about 900° and 920° C. for about 10 to 30 minutes. The thickness is between about 200 and 250 Angstroms.

In a key processing step, silicon nitride layer 34 is deposited on the surface of pad oxide layer 32. It is this layer that overcomes the problems noted with the PBLOCOS technique. The silicon nitride is deposited by low pressure chemical vapor deposition (LPCVD) by mixing $SiH_2Cl_2$ and $NH_3$ gases at between about 700° C. and 780° C. at a thickness of between about 300 and 400 Angstroms. This layer is thin in order to avoid stress during subsequent field oxidation.

A layer of polysilicon 36 is deposited over the surface of the silicon nitride 34, typically by LPCVD, at a temperature of between about 560° and 620° C. The thickness is between about 500 and 700 Angstroms. In this embodiment of the invention, this layer is deposited undoped.

A second silicon nitride layer 38 is now deposited on the surface of polysilicon layer 36. The silicon nitride is deposited by LPCVD under the same conditions as for first silicon nitride layer 34 at a thickness of between about 2000 and 2500 Angstroms.

An anisotropic ion etch is now performed to create the oxidation mask 40. This mask protects regions which are not desired to be oxidized, specifically the active device regions. Using conventional lithography and etching techniques as well known in the art, an opening is created over the pad oxide 32 and substrate 30. The pad oxide 32 acts as an etch stop.

Figure 4:
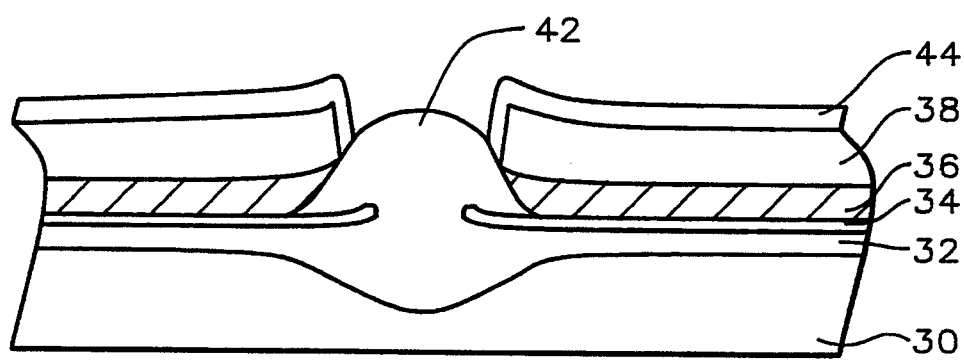

Referring now to FIG. 4, the field oxide isolation region 42 is formed. This is accomplished by exposing the wafer to an oxidizing environment as is well known in the art, at a temperature of between about 980° and 1100° C., for between about 30 and 50 minutes. The thickness of the field oxide 42 is between about 5000 and 6000 Angstroms for a wide mask, and between about 4500 and 5500 Angstroms for a narrow mask. During oxidation, thin oxide layer 44 forms on the surface of the second silicon nitride layer 38.

In conventional PBLOCOS, polysilicon 36 oxidizes near the interface with field oxide region 42 and oxygen can diffuse into pad oxide 32 and substrate 30 to cause extra bird's beak growth. In this invention, however, silicon nitride layer 34 prevents oxygen diffusion, and subsequently results in reduced bird's beak length.

Figure 5:
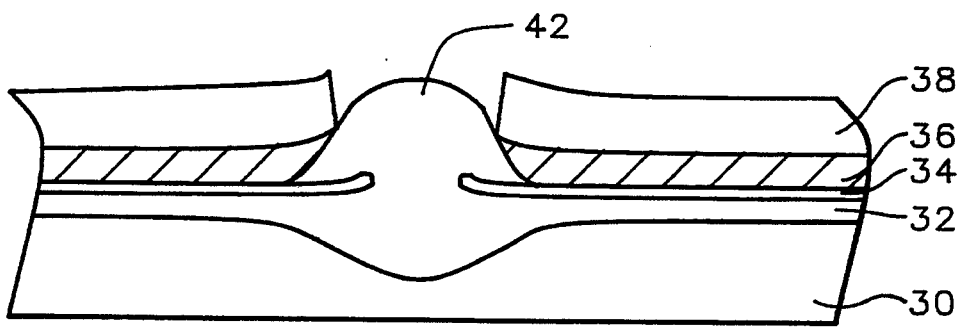
Figure 6:
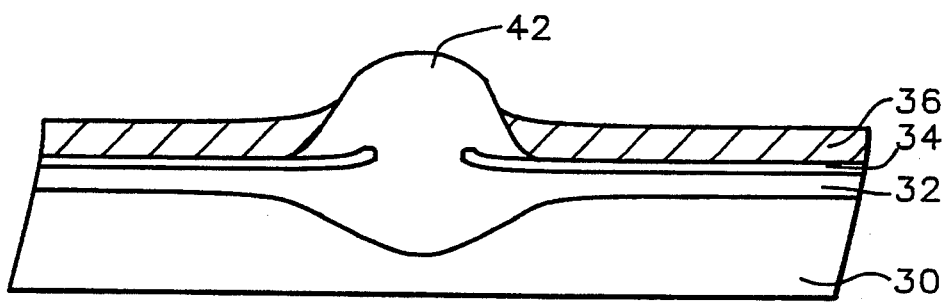

Thin oxide layer 44 is removed with a wet etch using hydrofluoric acid (HF) with a ratio of 20:1 ($H_2O$:HF) by weight for between about 0.5 and 2 minutes, resulting in the structure as shown in FIG. 5. When using the embodiment of the invention in which polysilicon layer 36 is undoped, a wet etch with phosphoric acid ($H_3PO_4$) is used to remove silicon nitride layer 38, as shown in FIG. 6. This etch requires between about 60 and 100 minutes at a temperature of between about 160° and 180° C.

Figure 7:
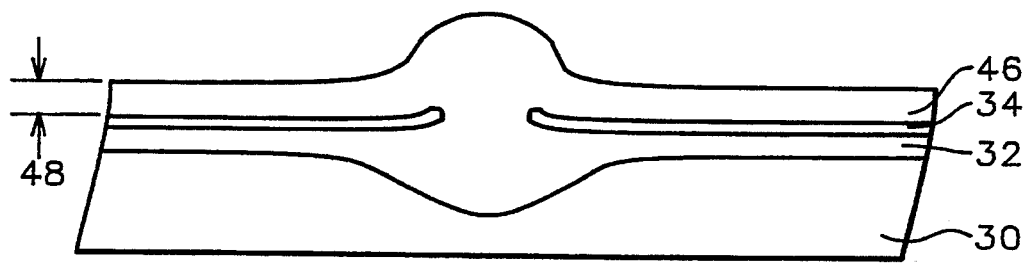

During the preceding etch, pits may form in polysilicon 36 near the interface with field oxide isolation region 42. These pits are removed, however, by oxidation of the polysilicon layer 36, as shown in FIG. 7, which is accomplished at a temperature of between about 870° and 920° C. for between about 20 and 40 minutes. The polysilicon oxide layer 46 has a thickness 48 of between about 800 and 1000 Angstroms.

Figure 8:
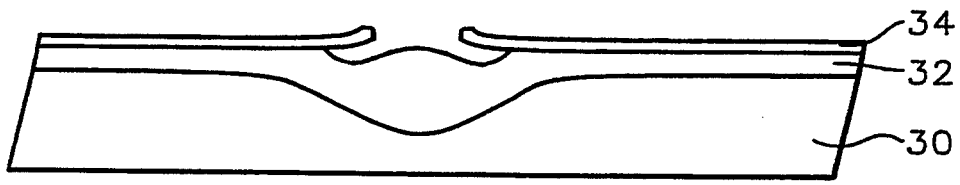

Referring now to FIG. 8, polysilicon oxide layer 46 is removed by a dip-back etch using HF at a ratio of 20:1 ($H_2O$:HF) by weight for between about 1 and 3 minutes, and removes a thickness of oxide of between about 800 and 1000 Angstroms. Silicon nitride layer 34 protects the field oxide/pad oxide interface to prevent the oxide thinning effect during this dip-back etch.

Figure 9:
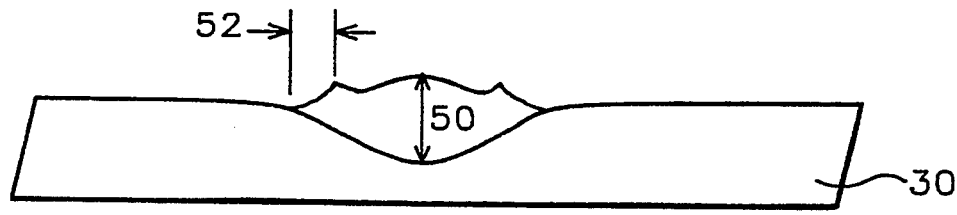

Referring now to FIG. 9, silicon nitride layer 34 is removed by a hot phosphoric etch, at a temperature of between about 160° and 180° C. for between about 10 and 20 minutes. A final dip-back etch of the remaining oxide is performed using hydroflouric acid at a ratio of 20:1 ($H_2O$:HF) by weight, for between about 1 and 2 minutes. This removes a thickness of oxide of between about 300 and 400 Angstroms, and results in the final field oxide isolation region shown in FIG. 9. Final field oxide thickness 50 is between about 3400 and 4400 Angstroms for a wide mask process, and between about 2900 and 3900 Angstroms for a narrow mask. Bird's beak length 52 is between about 0.05 and 0.2 microns.

It is a further embodiment of the invention to dope in-situ polysilicon layer 36 by adding phosphine during polysilicon deposition at a concentration of between about $1 \times 10^{19}$ and $1 \times 10^{20}$ atoms/cm.$^3$. It is well understood by those skilled in the art that other dopants, such as arsine, could be used in this step.

Processing after deposition of doped polysilicon layer 36 continues as above to result in the structure as shown in FIG. 5. A hot phosphoric etch is applied to the FIG. 5 structure. Since phosphoric acid etches both silicon nitride and doped polysilicon, nitride layer 38, polysilicon layer 36 and nitride layer 34 are removed in one etching step. Phosphoric acid at a temperature of between about 160° and 180° C. for between about 60 and 150 minutes is used to remove the three layers. Since all three layers are removed simultaneously, pits cannot form in the polysilicon.

A final dip-back etch of the remaining oxide is performed using hydroflouric acid at a ratio of 20:1 ($H_2O$:HF) by weight, for between about 1 and 2 minutes. This removes a thickness of oxide of between about 300 and 400 Angstroms, and results in the final field oxide isolation region as shown in FIG. 9. Field oxide thickness 50 is between about 4000 and 5500 Angstroms, and bird's beak length 52 is between about 0.05 and 0.2 microns. The bird's beak length is also shorter than the prior art in this embodiment, since silicon nitride layer 34 prevents oxygen diffusion during field oxidation formation.

While the invention has been particularly shown and described with reference to the preferred embodiments thereof, it will be understood by those skilled in the art that various changes in form and details may be made without departing from the spirit and scope of the invention.

What is claimed is:

1. A method of forming a silicon oxide isolation region with reduced bird's beak length, on the surface of a silicon substrate, comprising:
   forming a layer of silicon oxide on the surface of said silicon substrate;
   forming a first layer of silicon nitride having a thickness of between about 300 and 400 Angstroms on the surface of said silicon oxide layer, to prevent diffusion of oxygen into said silicon oxide layer and said silicon substrate during subsequent oxidation steps, thereby reducing said bird's beak length;
   forming a layer of polysilicon in-situ doped on the surface of said first silicon nitride layer;
   forming a second layer of silicon nitride on the surface of said polysilicon layer;
   patterning said second silicon nitride layer, said polysilicon layer, and said first silicon nitride layer to form an oxidation mask and to form an opening over said silicon oxide layer;
   ion implanting said silicon substrate through said opening to form a channel stop implant;
   oxidizing said silicon substrate in the area not masked by said oxidation mask, to form said silicon oxide isolation region, wherein during the oxidizing step a thin surface oxide layer forms on the surface of said second silicon nitride layer;
   removing said thin surface oxide layer;
   simultaneously removing said second silicon nitride layer, said polysilicon layer, and said first silicon nitride layer; and
   removing said silicon oxide layer, to complete formation of said silicon oxide isolation region.

2. The method of claim 1 wherein said simultaneously removing said second silicon nitride layer, said polysilicon layer, and said first silicon nitride layer is by etching in phosphoric acid at a temperature of between about 160° and 180° C.

3. The method of claim 1 wherein said ion implanting is performed after formation of said silicon oxide isolation region.

4. The method of claim 1 wherein formation of said opening over said silicon oxide layer is by a reactive ion etch, in which said silicon oxide layer acts as an etch stop.

5. The method of claim 1 wherein said thin surface oxide layer is removed by etching with hydrofluoric acid.

6. The method of claim 1 wherein removal of said silicon oxide layer is by etching with hydrofluoric acid.

7. A method for fabricating semiconductor devices having silicon oxide isolation structures, comprising:
   providing a silicon substrate;
   forming a layer of silicon oxide on the surface of said silicon substrate;
   forming a first layer of silicon nitride having a thickness of between about 300 and 400 Angstroms on the surface of said silicon oxide layer, to prevent diffusion of oxygen into said silicon oxide layer and said silicon substrate during subsequent oxidation steps, thereby reducing said bird's beak length;
   forming a layer of polysilicon on the surface of said silicon nitride layer;
   forming a second layer of silicon nitride on the surface of said polysilicon layer;
   patterning said second silicon nitride layer, said polysilicon layer, and said first silicon nitride layer to form oxidation masks and to form openings over said silicon oxide layer;
   ion implanting said silicon substrate through said openings to form channel stop implants;
   oxidizing said silicon substrate in the area not masked by said oxidation masks, to form said silicon oxide isolation structures, during which a thin surface oxide layer forms on the surface of said second silicon nitride layer;
   removing said thin surface oxide layer;
   removing said second silicon nitride layer;
   oxidizing said polysilicon layer;
   removing said oxidized polysilicon layer;
   removing said first silicon nitride layer;
   removing said silicon oxide layer, to complete formation of said silicon oxide isolation structures; and
   forming said semiconductor devices on and in said silicon substrate, and between said silicon oxide isolation structures.

8. The method of claim 7 wherein said polysilicon layer is undoped.

9. The method of claim 7 wherein formation of said openings over said silicon oxide layer is by a reactive ion etch, in which said silicon oxide layer acts as an etch stop.

10. The method of claim 7 wherein said thin surface oxide layer is removed by etching with hydrofluoric acid.

11. The method of claim 7 wherein said second silicon nitride layer is removed by phosphoric acid at a temperature of between about 160° and 180° C.

12. The method of claim 7 wherein removal of said oxidized polysilicon layer is by etching with hydrofluoric acid.

13. The method of claim 7 wherein removal of said first silicon nitride layer is by etching with phosphoric acid at a temperature of between about 160° and 180° C.

14. A method of forming a silicon oxide isolation region with reduced bird's beak length, on the surface of a silicon substrate, comprising:
   forming a layer of silicon oxide on the surface of said silicon substrate;
   forming a first layer of silicon nitride having a thickness of between about 300 and 400 Angstroms on the surface of said silicon oxide layer, to prevent diffusion of oxygen into said silicon oxide layer and said silicon substrate during subsequent oxidation steps, thereby reducing said bird's beak length;
   forming a layer of undoped polysilicon on the surface of said first silicon nitride layer;
   forming a second layer of silicon nitride on the surface of said polysilicon layer;
   patterning said second silicon nitride layer, said polysilicon layer, and said first silicon nitride layer to form an oxidation mask and to form an opening over said silicon oxide layer;

ion implanting said silicon substrate through said opening to form a channel stop implant; oxidizing said silicon substrate in the area not masked by said oxidation mask, to form said silicon oxide isolation region, wherein during the oxidizing step a thin surface oxide layer forms on the surface of said second silicon nitride layer;

removing said thin surface oxide layer;

removing said second silicon nitride layer;

oxidizing said polysilicon layer;

removing said oxidized polysilicon layer, whereby said first silicon nitride layer prevents oxide thinning at the field oxide—gate oxide interface during subsequent gate oxide formation;

removing said first silicon nitride layer; and removing said silicon oxide layer, to complete formation of said silicon oxide isolation region.

15. The method of claim 14 wherein said oxidized polysilicon layer is removed by a dip-back etch using hydrofluoric acid, for between about 1 and 3 minutes.

16. The method of claim 14 wherein said ion implanting is performed after formation of said silicon oxide isolation region.

17. The method of claim 14 wherein formation of said opening over said silicon oxide layer is by a reactive ion etch, in which said silicon oxide layer acts as an etch stop.

18. The method of claim 14 wherein said first and second silicon nitride layers are separately removed by etching with phosphoric acid at a temperature of between about 160° and 180° C.

19. The method of claim 14 wherein removal of said silicon oxide layer is by etching with hydrofluoric acid.

* * * * *